(12) United States Patent
Yamashita

(10) Patent No.: US 10,410,876 B2
(45) Date of Patent: Sep. 10, 2019

(54) APPARATUS AND METHOD FOR PROCESSING GAS, AND STORAGE MEDIUM

(71) Applicant: TOKYO ELECTRON LIMITED, Tokyo (JP)

(72) Inventor: Jun Yamashita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 161 days.

(21) Appl. No.: 15/629,027

(22) Filed: Jun. 21, 2017

(65) Prior Publication Data

US 2017/0372914 A1 Dec. 28, 2017

(30) Foreign Application Priority Data

Jun. 24, 2016 (JP) ................. 2016-125587

(51) Int. Cl.
*H01L 21/311* (2006.01)
*H01J 37/32* (2006.01)
*H01L 21/02* (2006.01)

(52) U.S. Cl.
CPC ........ *H01L 21/311* (2013.01); *H01J 37/3244* (2013.01); *H01J 37/32449* (2013.01); *H01L 21/02263* (2013.01); *H01L 21/31116* (2013.01); *H01J 2237/3322* (2013.01)

(58) Field of Classification Search
CPC ............. H01L 21/311; H01L 21/31116; H01L 21/02263; H01J 37/32449; H01J 37/3244; H01J 2237/3322

USPC ........................ 118/715; 156/345.33, 345.34
See application file for complete search history.

(56) References Cited

U.S. PATENT DOCUMENTS

| 5,733,586 A | * | 3/1998 | Herwegh ................ D01D 1/06 425/131.5 |
| 5,851,294 A | * | 12/1998 | Young ............... C23C 16/45508 118/715 |
| 5,992,453 A | * | 11/1999 | Zimmer .................... B05C 1/10 137/561 A |
| 6,125,788 A | * | 10/2000 | Hills ................. H01J 37/32082 118/723 MP |
| 6,170,428 B1 | * | 1/2001 | Redeker ............... C23C 16/507 118/715 |

(Continued)

FOREIGN PATENT DOCUMENTS

| JP | 2003-133300 A | 5/2003 |
| JP | 2013-541182 A | 11/2013 |

*Primary Examiner* — Rudy Zervigon
(74) *Attorney, Agent, or Firm* — Nath, Goldberg & Meyer; Jerald L. Meyer

(57) ABSTRACT

An apparatus for processing a gas includes: a mounting part installed in a processing container and on which a substrate is mounted; a first gas flow path where a first gas is supplied from a first gas supply mechanism to an upstream portion of the first gas flow path, and a downstream portion of the first gas flow path is branched to form first branch paths; a second gas flow path where a second gas is supplied from a second gas supply mechanism to an upstream portion of the second gas flow path, and a downstream portion of the second gas flow path is branched to form second branch paths; an annular mixing chamber to which a discharge path is connected; and a gas discharge part discharging a mixture gas.

6 Claims, 13 Drawing Sheets

(56) References Cited

U.S. PATENT DOCUMENTS

| | | | |
|---|---|---|---|
| 6,261,080 B1 * | 7/2001 | Schroter | D01D 4/06 425/378.2 |
| 6,709,523 B1 * | 3/2004 | Toshima | G03F 7/265 118/715 |
| 7,172,399 B2 * | 2/2007 | Reutter | D01D 1/09 264/169 |
| 7,252,716 B2 * | 8/2007 | Kim | C23C 16/4558 118/715 |
| 7,691,203 B2 * | 4/2010 | Inagaki | C23C 16/4411 118/715 |
| 7,712,434 B2 * | 5/2010 | Dhindsa | H01J 37/32009 118/723 E |
| 8,092,598 B2 * | 1/2012 | Baek | C23C 16/4412 118/715 |
| 9,175,394 B2 * | 11/2015 | Yudovsky | C23C 16/45504 |
| 9,287,095 B2 * | 3/2016 | Nguyen | H01J 37/3244 |
| 9,390,933 B2 * | 7/2016 | Narushima | H01L 21/6708 |
| 9,466,468 B2 * | 10/2016 | Okayama | H01J 37/3244 |
| 9,540,731 B2 * | 1/2017 | Noorbakhsh | C23C 16/45565 |
| 9,887,108 B2 * | 2/2018 | Uchida | H01J 37/32091 |
| 10,208,380 B2 * | 2/2019 | Zhang | C23C 16/34 |
| 10,256,107 B2 * | 4/2019 | Imai | H01L 21/31056 |
| 2004/0099378 A1 * | 5/2004 | Kim | C23C 16/4558 156/345.33 |
| 2005/0092247 A1 * | 5/2005 | Schmidt | C23C 16/45512 118/715 |
| 2006/0112876 A1 * | 6/2006 | Choi | C23C 16/45563 118/715 |
| 2007/0181531 A1 * | 8/2007 | Horiguchi | C23C 16/24 216/67 |
| 2007/0187363 A1 * | 8/2007 | Oka | H01J 37/3244 216/59 |
| 2007/0256785 A1 * | 11/2007 | Pamarthy | H01J 37/3244 156/345.33 |
| 2008/0121178 A1 * | 5/2008 | Bang | C23C 16/4405 118/723 I |
| 2009/0104351 A1 * | 4/2009 | Kakegawa | C23C 16/34 427/248.1 |
| 2011/0162800 A1 * | 7/2011 | Noorbakhsh | C23C 16/45565 156/345.34 |
| 2011/0223334 A1 * | 9/2011 | Yudovsky | C23C 16/45504 427/255.23 |
| 2013/0160709 A1 * | 6/2013 | White | C23C 16/4402 118/715 |
| 2014/0174362 A1 * | 6/2014 | Kao | C23C 16/45565 118/723 R |
| 2014/0239091 A1 * | 8/2014 | Huang | C23C 16/4401 239/128 |
| 2015/0187593 A1 * | 7/2015 | Narushima | H01L 21/6708 438/735 |
| 2015/0376784 A1 * | 12/2015 | Wu | C23C 16/45508 427/255.28 |
| 2016/0083837 A1 * | 3/2016 | Narushima | C23C 16/4408 118/725 |
| 2016/0097119 A1 * | 4/2016 | Cui | H01J 37/32357 134/1.1 |
| 2017/0101712 A1 * | 4/2017 | Bansal | C23C 16/45574 |
| 2017/0243753 A1 * | 8/2017 | Imai | H01L 21/31056 |
| 2017/0314130 A1 * | 11/2017 | Hirose | C23C 16/45544 |
| 2017/0350688 A1 * | 12/2017 | Boyd, Jr. | G01B 9/02023 |
| 2017/0372914 A1 * | 12/2017 | Yamashita | H01J 37/3244 |
| 2018/0102244 A1 * | 4/2018 | Satoh | H01L 21/02274 |

* cited by examiner

APPARATUS AND METHOD FOR PROCESSING GAS, AND STORAGE MEDIUM

CROSS-REFERENCE TO RELATED APPLICATION

This application claims the benefit of Japanese Patent Application No. 2016-125587, filed on Jun. 24, 2016, in the Japan Patent Office, the disclosure of which is incorporated herein in its entirety by reference.

TECHNICAL FIELD

The present disclosure relates to a technique of processing a substrate by supplying a mixture gas, which is generated by mixing various kinds of gases, onto the substrate.

BACKGROUND

In a process of manufacturing a semiconductor device, various kinds of gas processing are performed on a semiconductor wafer (hereinafter referred to as a wafer) as a substrate. There is a case that this gas processing is performed by mixing various kinds of gases and supplying a mixture gas onto the wafer. In that case, a common gas flow path, for the plurality of gases supplied from the upstream side, mixes each gas while flowing therein and is installed in a processing apparatus.

However, since the gases are not sufficiently mixed in the common gas flow path, the concentration distribution of the gases may be biased in the downstream side of the common gas flow path. As a result, there is a concern that the uniformity of processing of various portions in the plane of the wafer is not sufficiently increased due to different concentration distributions of the gases in the various portions of the wafer.

It is conceivable to detect a specific flow rate ratio of each gas at which a deviation of the concentration distribution can be suppressed and to process the wafer with the detected specific flow rate ratio. However, in order to increase the degree of freedom of wafer processing, it is required to set a wide range of flow rate ratios, without being limited to such a specific flow rate ratio. Further, it is conceivable to install a rectifying member in the common gas flow path so that, for example, the gases form a swirl flow and are efficiently mixed. However, since a space in which the processing apparatus can be installed is limited and the size of the common gas flow path is also limited, such a rectifying member cannot be installed.

For example, there has been proposed a film forming apparatus for forming a metal oxide thin film on a wafer. In this film forming apparatus, a vertically elongated gas mixing part is installed above a gas shower head, a precursor gas and a dilution gas supplied from an upper side of the gas mixing part respectively are mixed with each other while flowing downward within a space in the gas mixing part and are further mixed with an oxidizing gas supplied into the gas shower head. With such a configuration, it may be said that the gases can be mixed while suppressing the size of the mixing part. However, there is a need for a technique for further suppressing the size of the apparatus and mixing the gases with higher reliability. There has also been proposed an apparatus for supplying and dispersing a processing gas on a substrate by means of a manifold. However, this proposed technique does not involve solving the above problem.

SUMMARY

Some embodiments of the present disclosure provide a technique capable of mixing a plurality of gases to be supplied onto a substrate to be processed, with high reliability.

According to one embodiment of the present disclosure, there is provided an apparatus for processing a gas, including: a mounting part installed in a processing container having a vacuum atmosphere and on which a substrate is mounted; a first gas flow path in which a first gas is supplied from a first gas supply mechanism to an upstream portion of the first gas flow path, and a downstream portion of the first gas flow path is branched to form a plurality of first branch paths; a second gas flow path in which a second gas is supplied from a second gas supply mechanism to an upstream portion of the second gas flow path, and a downstream portion of the second gas flow path is branched to form a plurality of second branch paths; an annular mixing chamber to which a discharge path is connected; and a gas discharge part being configured to discharge a mixture gas supplied from the discharge path onto the substrate, wherein the annular mixing chamber includes a plurality of first positions separated from each other in a circumferential direction, each of downstream ends of the plurality of first branch paths being connected to each of the plurality of first positions; and a plurality of second positions separated from each other in the circumferential direction, each of downstream ends of the plurality of second branch paths being connected to each of the plurality of second positions, and is configured to generate the mixture gas by mixing the first gas and the second gas flowing from the first branch paths and the second branch paths into the discharge path.

According to another embodiment of the present disclosure, there is provided a method for processing a gas, including: mounting a substrate on a mounting part installed in a processing container having a vacuum atmosphere; supplying a first gas from an upstream portion of a first gas flow path whose downstream portion is branched to form a plurality of first branch paths; supplying a second gas from an upstream portion of a second gas flow path whose downstream portion is branched to form a plurality of second branch paths; generating a mixture gas by supplying the first gas and the second gas into an annular mixing chamber including a plurality of first positions separated from each other in a circumferential direction, each of downstream ends of the plurality of first branch paths being connected to each of the plurality of first positions; and a plurality of second positions separated from each other in the circumferential direction, each of downstream ends of the plurality of second branch paths being connected to each of the plurality of second positions; and flowing the first gas and the second gas from the plurality of first positions and the plurality of second positions into a discharge path connected to the mixing chamber, and discharging the mixture gas, which is supplied from the discharge path, from a gas discharge part onto the substrate.

According to another embodiment of the present disclosure, there is provided a non-transitory computer-readable storage medium storing a computer program used in a gas processing apparatus for performing gas processing on a substrate, wherein the computer program is used to perform the aforementioned method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
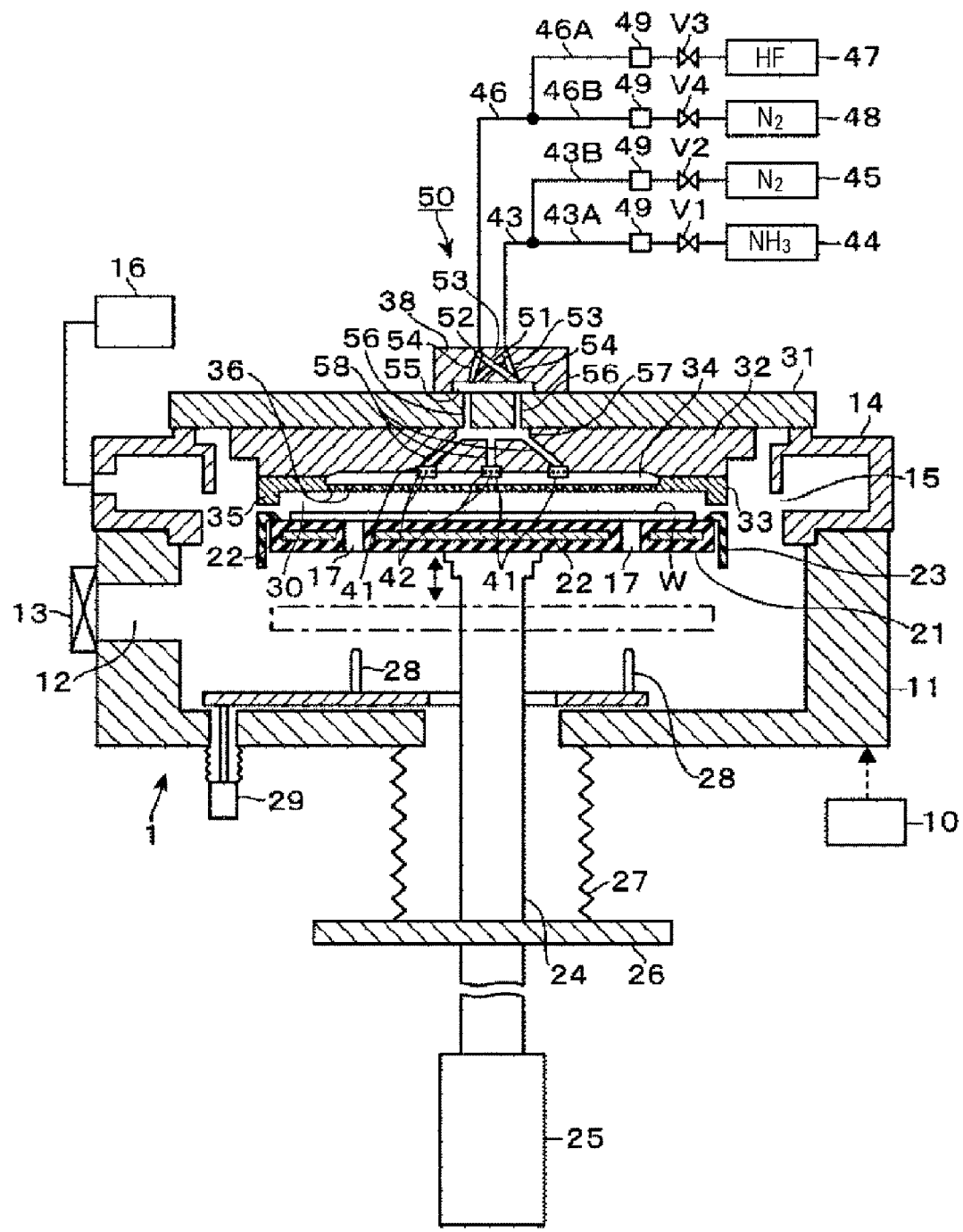
FIG. 1 is a longitudinal sectional side view of an etching apparatus according to the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An etching apparatus 1 which is an embodiment of a gas processing apparatus of the present disclosure will be described with reference to a longitudinal sectional side view of FIG. 1. The etching apparatus 1 includes a processing container 11 which is a vacuum container for storing and processing a wafer W, supplies a HF (hydrogen fluoride) gas and a $NH_3$ (ammonia) gas as processing gases onto the wafer W and etches a $SiO_2$ film formed on a surface of the wafer W. This etching is performed by a method called ALE (Atomic Layer Etching).

The ALE is a method for alternately and repeatedly supplying each of processing gases into the processing container 11 and etching the wafer W by chemical reaction between a processing gas supplied earlier and adsorbed on the surface of the wafer W, and a processing gas supplied later and the surface of the wafer W. After the processing gases are supplied and before the next processing gas is supplied, a purge gas is supplied into the processing container 11 to remove (purge) the processing gases remaining in the processing container 11. Therefore, assuming that one cycle includes supplying a HF gas, purging the HF gas, supplying a $NH_3$ gas and purging the $NH_3$ gas in this order, this cycle is repeated to process the wafer W.

The processing container 11 has substantially a flat circular shape. A wafer loading/unloading port 12 and a gate valve 13 for opening/closing the loading/unloading port 12 are installed in a side wall of the processing container 11. Above the loading/unloading port 12, an exhaust duct 14 is installed. The exhaust duct 14 constitutes a part of the side wall of the processing container 11 and is formed by annularly bending a duct whose longitudinal sectional shape is square. A slit-shaped opening 15 is formed on an inner circumferential surface of the exhaust duct 14 and extends in a circumferential direction. An exhaust part 16 constituted by, for example, a pressure regulating valve and a vacuum pump is connected to the exhaust duct 14. The processing container 11 is exhausted by the exhaust part 16 so that an internal pressure of the processing container 11 becomes a desired vacuum pressure.

A circular mounting table 21 (mounting part) for horizontally mounting the wafer W is installed in the processing container 11. A heater 22 for heating the wafer W is buried inside the mounting table 21. Reference numeral 23 in FIG. 1 denotes a cylindrical cover member. The cylindrical cover member is installed to stand on the mounting table 21 so as to cover an outer periphery of the mounting table 21. Since an upper end portion of the cover member 23 is bent inward when viewed from a longitudinal section, the cover member 23 covers a peripheral edge portion of an upper surface of the mounting table 21. A region surrounded by the cover member 23 is where the wafer W is mounted.

An upper end of a support member 24, which penetrates a bottom of the processing container 11 and extends in a vertical direction, is connected to the center of a lower surface of the mounting table 21. A lower end of the support member 24 is connected to an elevator mechanism 25. The elevator mechanism 25 moves up and down the mounting table 21 between a lower position indicated by an alternate long and short dash line in FIG. 1 and an upper position indicated by a solid line in FIG. 1. The lower position is a transfer position for transferring the wafer W to/from a transfer mechanism (not shown) of the wafer W entering the processing container 11 from the loading/unloading port 12. The upper position is a processing position where processing is performed on the wafer W.

Reference numeral 26 in FIG. 1 denotes a flange installed on the support member 24 below the bottom of the processing container 11. Reference numeral 27 in FIG. 1 denotes a bellows. The bellows 27 can expand and contract, and has an upper end connected to the bottom of the processing container 11 and a lower end connected to the flange 26, respectively, so as to ensure the airtightness of the processing container 11. Reference numeral 28 in FIG. 1 denotes three support pins (only two are shown in the figure) and Reference numeral 29 in FIG. 1 denotes an elevator mechanism moving up and down the support pins 28. When the mounting table 21 is at the transfer position, the support pins 28 move up and down via through-holes 17 formed in the mounting table 21 to protrude and retract from the upper surface of the mounting table 21, so that the wafer W is transferred between the mounting table 21 and the transfer mechanism.

A support plate 31 is installed above the exhaust duct 14 so as to close an interior of the processing container 11 from the upper side of the processing container 11. A ceiling plate member 32 is installed under a central portion of a lower surface of the support plate 31. The support plate 31 and the ceiling plate member 32 form a ceiling part of the processing container 11. A circular concave portion is formed in a central portion of a lower surface of the ceiling plate member 32. A horizontal plate-like shower head 33 is installed under the ceiling plate member 32 so as to cover the entire lower surface of the ceiling plate member 32 and to face the mounting table 21. The concave portion of the ceiling plate member 32 is configured as a flat circular diffusion space 34 where a gas supplied from a gas discharge part 41 is diffused, and it will be described later.

Figure 2:
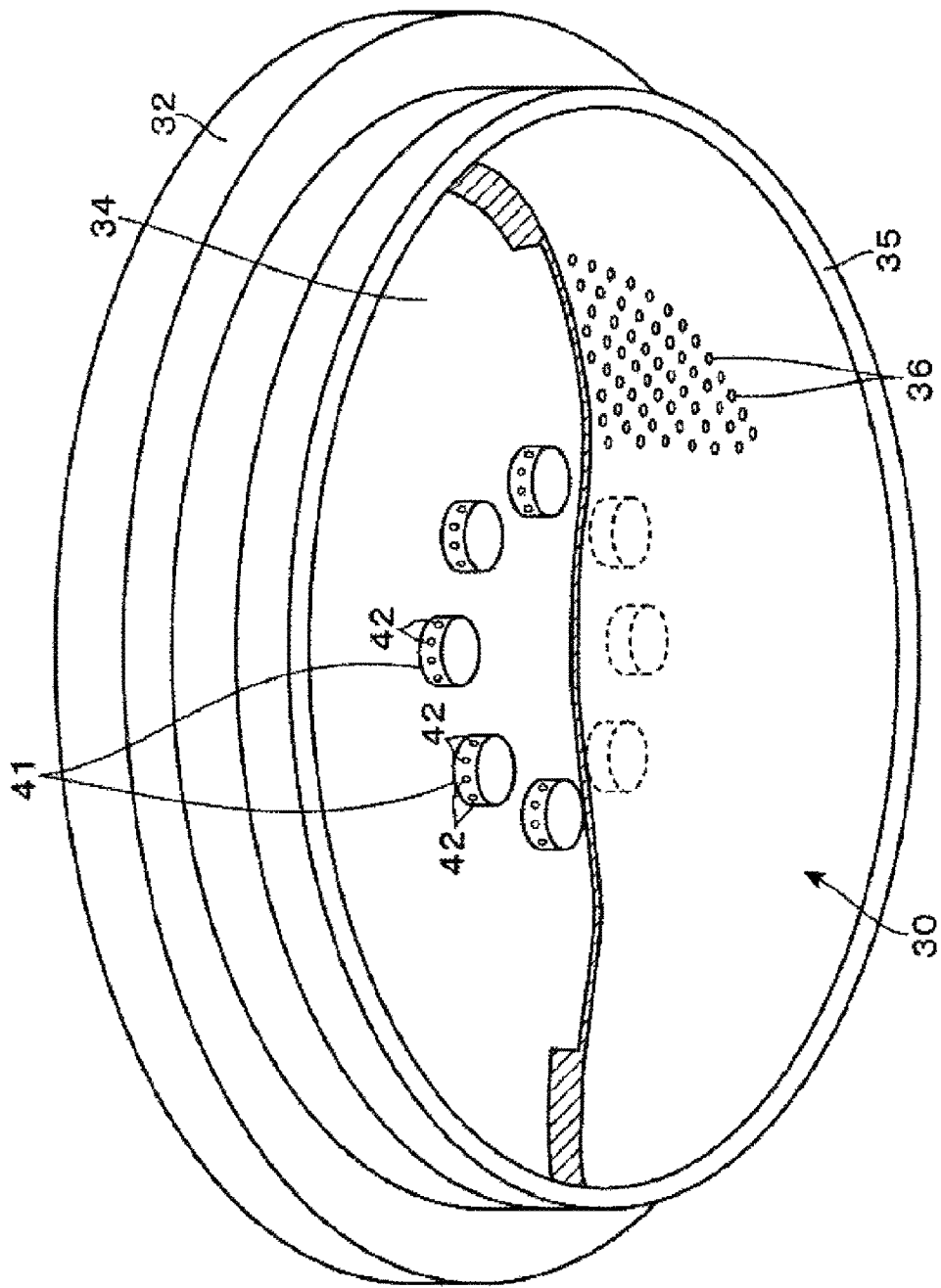
FIG. 2 is a perspective view of a ceiling part of a processing container constituting the etching apparatus.

FIG. 2 is a perspective view showing the diffusion space 34 by cutting out a portion of the shower head 33. Referring to FIG. 2, a peripheral edge of a lower surface of the shower head 33 protrudes downward to form an annular projection 35 and is in proximity to the cover member 23 of the mounting table 21 at the processing position. A plurality of gas discharge holes 36 opened to the diffusion space 34 are dispersedly disposed in an inner region of the annular projection 35 in the lower surface of the shower head 33. In FIG. 2, only a part of the gas discharge holes 36 is shown. The lower surface of the shower head 33 is a flat surface and faces the upper surface of the mounting table 21.

In the lower surface of the ceiling plate member 32, eight gas discharge parts 41 are installed to protrude into the diffusion space 34 at equal intervals along a circumferential direction of the diffusion space 34. The gas discharge parts 41 are formed in a circular shape and a plurality of gas supply holes 42 are opened on a side surface of each of the gas discharge parts 41 at intervals along its circumferential direction. These gas supply holes 42 are drilled in a horizontal direction. A gas introduction port (not shown) is formed above the gas discharge parts 41. Each of the above-mentioned gases introduced from the gas introduction port is discharged from the gas supply holes 42 via a gas path formed in each of the gas discharge parts 41. The gas discharged into the diffusion space 34 is supplied to the wafer W through the gas discharge holes 36 of the shower head 33. A space surrounded by the lower surface and the annular projection 35 of the shower head 33 and the upper surface of the mounting table 21 forms a processing space 30 in which the etching process is performed.

Figure 3:
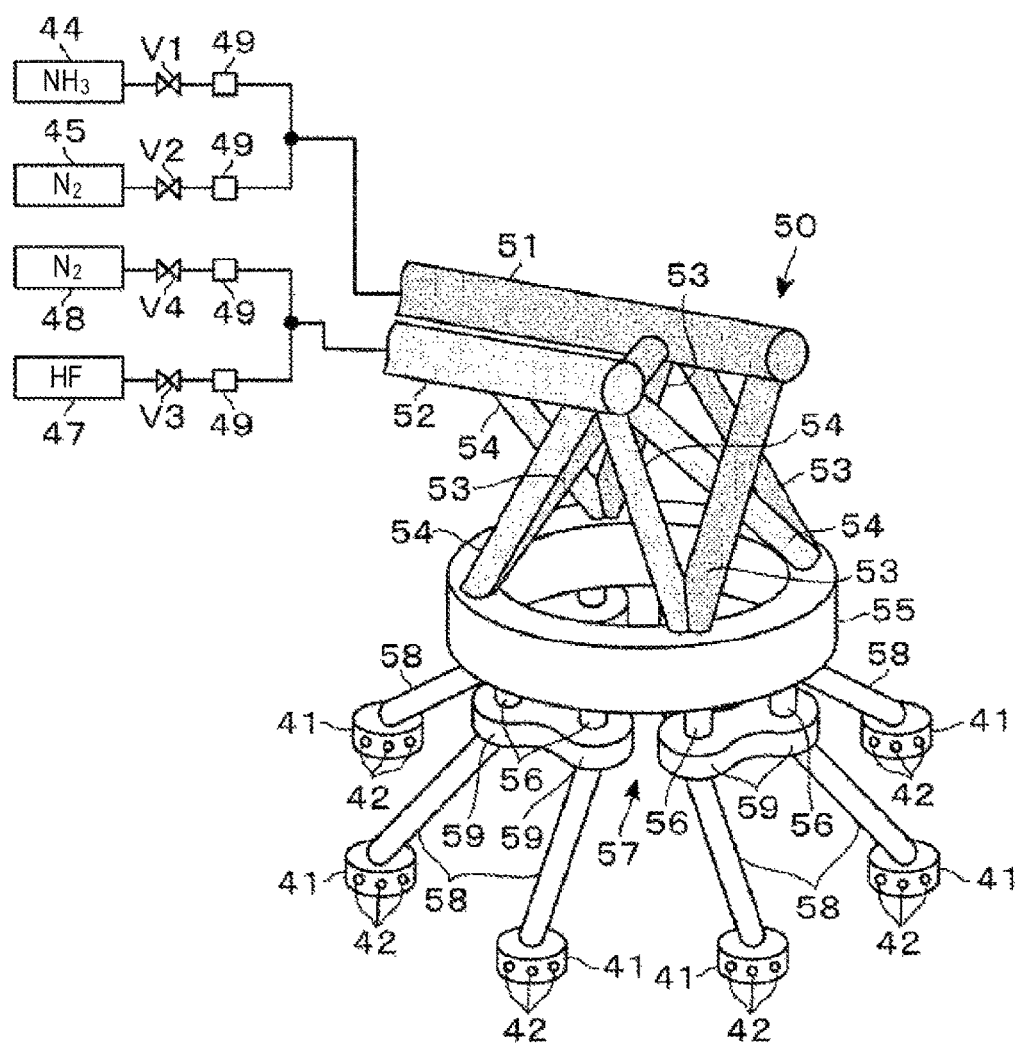
FIG. 3 is a perspective view of a gas flow path installed in the etching apparatus.
Figure 4:
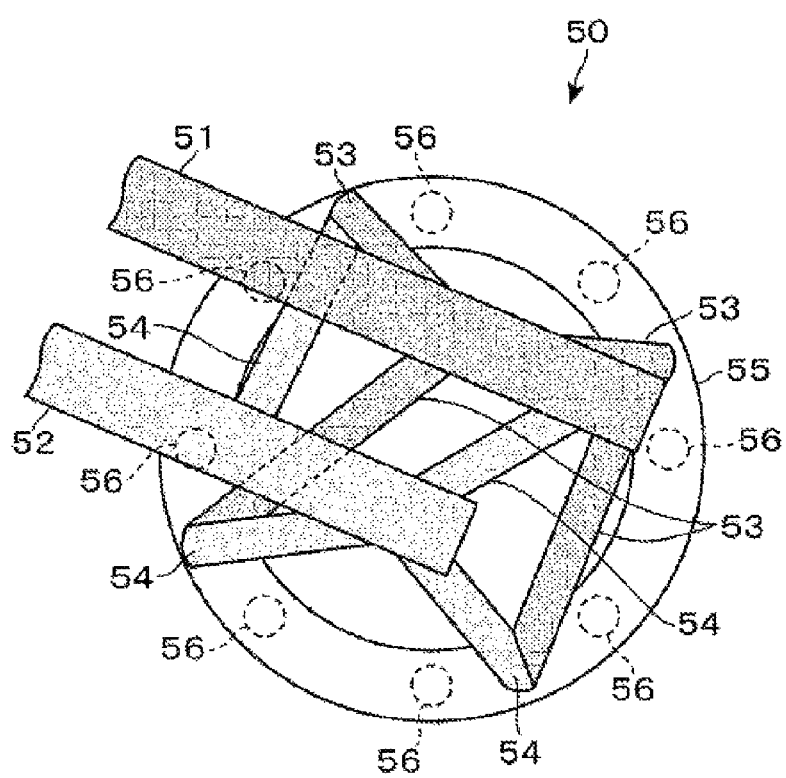
FIG. 4 is a top view of an upper side of the gas flow path.

A gas introduction block 38 is installed above a central portion of the support plate 31 (see FIG. 1). The gas introduction block 38, the support plate 31 and the ceiling plate member 32 form a gas supply path 50 for introducing a gas into the gas discharge parts 41. FIG. 3 is a perspective view showing the gas supply path 50 and FIG. 4 is a top view showing an upper portion of the gas supply path 50. The gas supply path 50 includes horizontal gas flow paths 51 and 52, branch paths 53 and 54, a first gas mixing chamber 55, a discharge path 56, a second gas mixing chamber 57 and a gas flow path 58. The horizontal gas flow paths 51 and 52, the branch paths 53 and 54 and the first gas mixing chamber 55 are installed in the gas introduction block 38. The discharge path 56 is installed in the support plate 31. The second gas mixing chamber 57 and the gas flow path 58 are installed in the ceiling plate member 32.

The horizontal gas flow paths 51 and 52 are partitioned from each other, and are elongated laterally and are formed to be parallel to each other. A downstream end of a gas supply pipe 43 is connected to the upstream portion of the horizontal gas flow path 51 forming a first gas flow path. The upstream portion of the gas supply pipe 43 is branched to form branch pipes 43A and 43B. A $NH_3$ gas supply source 44 and a $N_2$ (nitrogen) gas supply source 45 are connected to the upstream portion of the branch pipes 43A and 43B, respectively. A downstream end of a gas supply pipe 46 is connected to the upstream portion of the horizontal gas flow path 52 forming a second gas flow path. The upstream portion of the gas supply pipe 46 is branched to form branch pipes 46A and 46B. A HF gas supply source 47 and a $N_2$ gas supply source 48 are connected to the upstream portion of the branch pipes 46A and 46B, respectively. Although it is shown in FIG. 1 that different $N_2$ gas supply sources 45 and 48 are respectively connected to the branch pipes 43B and 46B, a common $N_2$ gas supply source may be connected to the branch pipes 43B and 46B.

In the branch pipes 43A, 43B, 46A and 46B, flow rate regulating parts 49 and valves are respectively disposed, for example, in this order toward the upstream portion. The flow rate regulating parts 49 are constituted by a mass flow controller and regulate flow rates of gases supplied to the downstream portion of the respective branch pipes 43A, 43B, 46A and 46B. The valves disposed in the branch pipes 43A, 43B, 46A and 46B are denoted by V1, V2, V3 and V4, respectively. These valves V1 to V4 are opened and closed independently of each other. By opening and closing the valves V1 and V2, supply and stoppage of the $NH_3$ gas and the $N_2$ gas to the horizontal gas flow path 51 are performed, respectively. By opening and closing the valves V3 and V4, supply and stoppage of the HF gas and the $N_2$ gas to the horizontal gas flow path 52 are performed, respectively. The $NH_3$ gas and the $N_2$ gas supplied respectively from the $NH_3$ gas supply source 44 and the $N_2$ gas supply source 45 are first gases. A first gas supply mechanism is constituted by the $NH_3$ gas supply source 44, the $N_2$ gas supply source 45, the valves V1 and V2 and the flow rate regulating parts 49 of the branch pipes 43A and 43B. The HF gas and the $N_2$ gas supplied respectively from the HF gas supply source 47 and the $N_2$ gas supply source 48 are second gases. A second gas supply mechanism is constituted by the HF gas supply source 47, the $N_2$ gas supply source 48, the valves V3 and V4 and the flow rate regulating parts 49 of the branch pipes 46A and 46B.

As an inert gas, the $N_2$ gas is continuously supplied to the horizontal gas flow paths 51 and 52 in parallel at all times during processing the wafer W. When the $NH_3$ gas and the HF gas are not supplied to the horizontal gas flow paths 51 and 52, the $N_2$ gas thus supplied acts as a purge gas for removing the $NH_3$ gas or the HF gas remaining in the processing space 30. When the $NH_3$ gas and the HF gas are respectively supplied to the horizontal gas flow paths 51 and 52, the $N_2$ gas acts as a carrier gas for stably introducing the $NH_3$ gas and the HF gas into the processing space 30. Since the $N_2$ gas is continuously supplied to the horizontal gas flow paths 51 and 52, a time required for the above-mentioned one cycle of ALE is prevented from being lengthened.

Therefore, while the HF gas or the $NH_3$ gas, which is a processing gas, is being supplied to one of the horizontal gas flow paths 51 and 52, the $N_2$ gas is supplied to the other of the horizontal gas flow paths 51 and 52. In order to make the concentration of the processing gas in the diffusion space 34 uniform, the gases supplied respectively from the horizontal gas flow paths 51 and 52 are sufficiently mixed in gas flow paths in the downstream of the horizontal gas flow paths 51 and 52 in the gas supply path 50, and then the mixed gases are introduced to each of the gas discharge parts 41. Hereinafter, a configuration of the downstream of the horizontal gas flow paths 51 and 52 will be described.

The four elongated branch paths 53 and the four elongated branch paths 54 extend obliquely downward from a downstream end portion of the horizontal gas flow path 51 and a downstream end portion of the horizontal gas flow path 52, respectively. For clarity of illustration, in FIGS. 3 and 4, the horizontal gas flow path 51 and the branch paths 53 are indicated by a gray scale with a higher concentration and the horizontal gas flow path 52 and the branch paths 54 are indicated by a gray scale with a lower concentration.

In addition, the first gas mixing chamber 55 is formed in a horizontal, flat and circular ring shape, and the gases supplied respectively from the branch paths 53 and 54 are mixed in the first gas mixing chamber 55. Downstream ends of the branch paths 53 and downstream ends of the branch paths 54 are connected to an upper portion of the first gas mixing chamber 55. Positions at which the branch paths 53 and 54 are connected will be described below in detail. Each of the four branch paths 53 is connected to each of the positions separated from each other in a circumferential direction of the first gas mixing chamber 55, and each of the four branch paths 54 is connected to each of the positions separated from each other in the circumferential direction of the first gas mixing chamber 55.

In addition, the downstream end of the branch path 53, which is a first branch path, and the downstream end of the branch path 54, which is a second branch path, join with each other right on the first gas mixing chamber 55 and are connected to the first gas mixing chamber 55. In other words, assuming that, in the first gas mixing chamber 55, the position where the branch path 53 is connected and the position where the branch path 54 is connected are a first position and a second position, respectively, the first position coincides with the second position and the gas is introduced from the branch paths 53 and 54 to four positions of the first gas mixing chamber 55. The branch paths 53 and 54 for supplying gases to the same position may be described as a set of the branch paths. The manner in which the gases are mixed in the first gas mixing chamber 55 will be described below in detail.

Each of eight elongated discharge paths 56 extends vertically downward from each of the positions separated from each other in the circumferential direction of a lower portion of the first gas mixing chamber 55. In order to ensure that the gases supplied respectively from the branch paths 53 and 54 are circulated in the circumferential direction in the first gas mixing chamber 55 and mixed and then are introduced into the discharge paths 56 and discharged from the discharge paths 56, as shown in FIG. 4, when viewed from the top of the first gas mixing chamber 55, positions of the downstream ends of the branch paths 53 and 54 and positions of upstream ends of the discharge paths 56 are deviated from each other in the circumferential direction.

Figure 5:
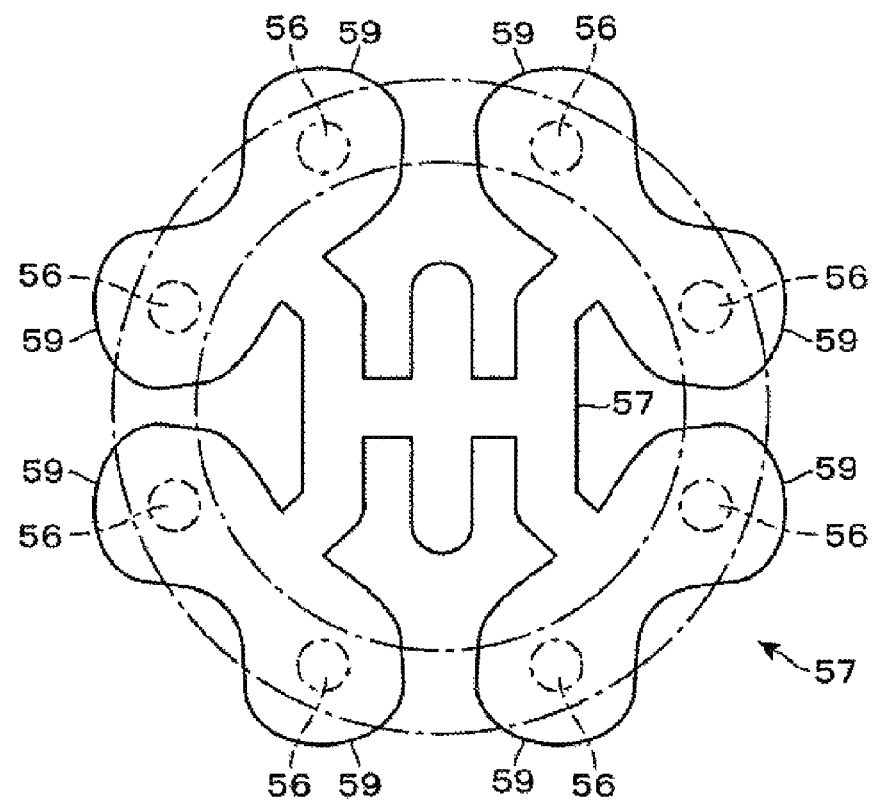
FIG. 5 is a top view of a portion of the gas flow path.

A downstream end of the discharge path 56 is connected to an upper surface of the second gas mixing chamber 57. FIG. 5 shows the upper surface of the second gas mixing chamber 57. The second gas mixing chamber 57 is a flat space and has six elongated gas flow paths radially extending from a region overlapping a central portion of the first gas mixing chamber 55 when viewed from the top. Four of the six gas flow paths are branched to the left and the right when viewed in the direction of their extension. End portions of these branched flow paths are defined as branch end portions 59. That is, eight branch end portions 59 are formed. Two gas flow paths not forming the branch end portions 59 extend in opposite directions and each of these two gas flow paths is sandwiched between the gas flow paths forming the branch end portions 59. As shown in FIG. 5, the downstream ends of the discharge paths 56 are connected to upper sides of the respective branch end portions 59.

An upstream end of the gas flow path 58 is connected to a lower portion of each branch end portion 59 while overlapping the downstream end of each discharge path 56. Therefore, eight gas flow paths 58 are provided. Each gas flow path 58 is formed in an elongated shape and extends downward and radially when viewed from the top. A downstream end of each gas flow path 58 is connected to a gas inlet of each gas discharge part 41 and introduces a gas into the gas discharge part 41.

As described above, since the second gas mixing chamber 57 is a space common to the discharge paths 56, the gases supplied from the discharge paths 56 are mixed in the second gas mixing chamber 57. However, since the gases respectively supplied from the horizontal gas flow paths 51 and 52 have already been mixed in the first gas mixing chamber 55, there is a concern that the concentration of the processing gas in each part of the gas flow path 58 is biased depending on the mixing condition of the gases in the second gas mixing chamber 57. Therefore, as described above, the downstream end of the discharge path 56 and the upstream end of the gas flow path 58 are formed to overlap each other so that the gases are not excessively mixed in the second gas mixing chamber 57. The second gas mixing chamber 57 may not be provided and the discharge path 56 may be directly connected to the gas discharge part 41.

Referring back to FIG. 1, the etching apparatus 1 is provided with a control part 10 made up of, for example, a computer. The control part 10 includes a data processor including a program, a memory and a CPU, and the like. The program contains instructions (steps) for sending a control signal from the control part 10 to each part of the etching apparatus 1 to execute an etching process to be described later. More specifically, the opening/closing timing of respective valves V1 to V4, the flow rate of each gas by the flow rate regulating part 49, the pressure of the processing space 30 by the exhaust part 16, the moving-up/down of the mounting table 21 by the elevator mechanism 25, the moving-up/down of the support pins 28 by the elevator mechanism 29, the temperature of the wafer W by the heater 22, and the like are controlled by the above program. This program is stored in a storage medium such as a compact disk, a hard disk, a magneto-optical disk (MO), etc., and is installed in the control part 10.

Figure 6:
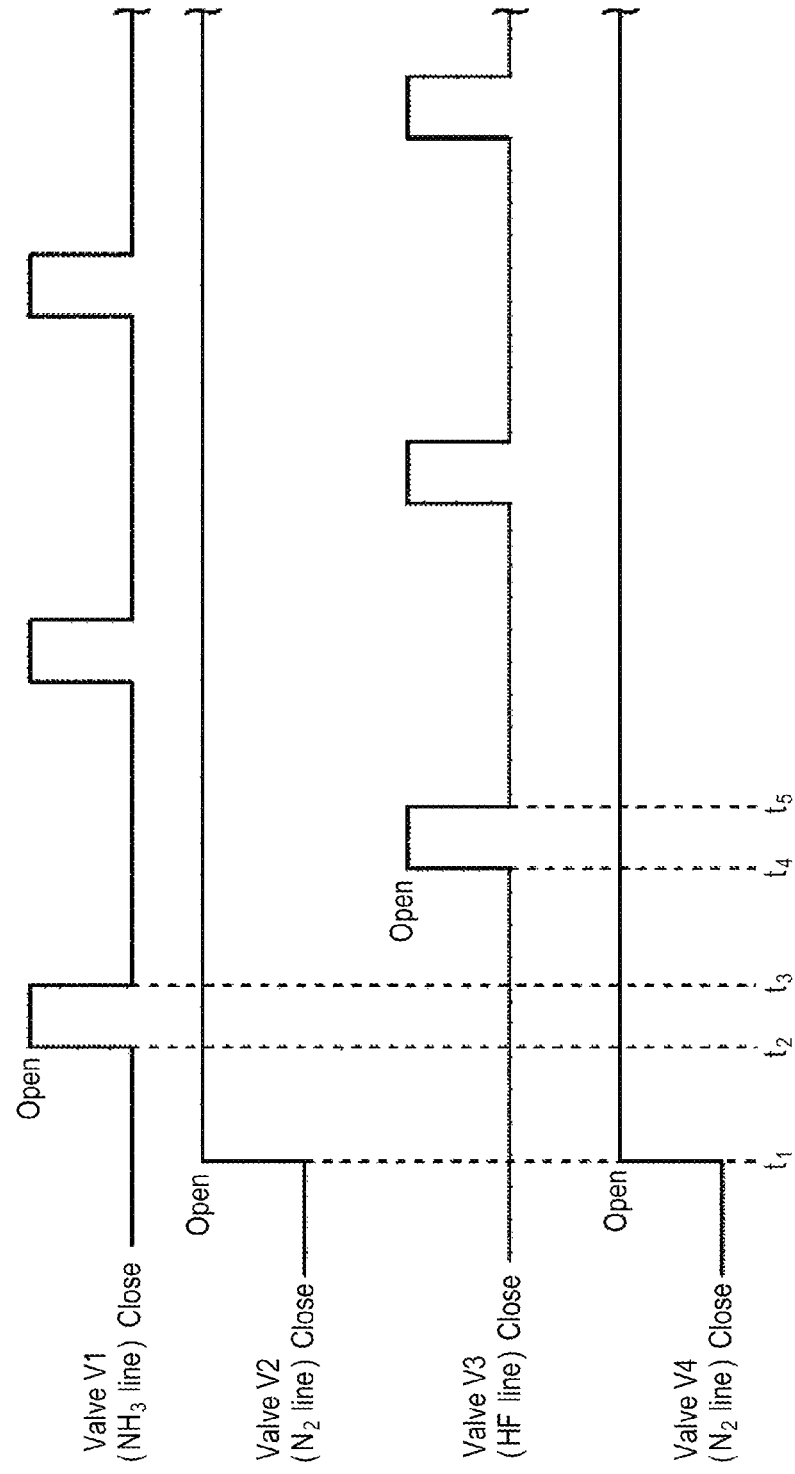
FIG. 6 is a timing chart showing supply and stoppage of each gas into the processing container.

Next, the operation of the etching apparatus 1 will be described with reference to a timing chart of FIG. 6 showing the opening and closing states of the valves V1 to V4. This chart shows how a level of each valve is changed. In this chart, it is assumed that a valve is closed when the level is low and the valve is opened when the level is high. Since a gas is supplied from each of the gas supply sources 44, 45, 47 and 48 into the processing space 30 via the gas supply path 50 by opening the valves V1 to V4, FIG. 6 shows timings at which each gas is supplied into the gas supply path 50 and the processing space 30.

First, in a state that the interior of the processing container 11 is exhausted to a vacuum atmosphere of a predetermined pressure, the gate valve 13 is opened, and the wafer W is transferred from a transfer chamber (not shown), which is in a vacuum atmosphere and adjacent to the processing container 11, onto the mounting table 21 positioned in the transfer position by the transfer mechanism. After the wafer W is transferred to the mounting table 21 by the moving-up/down of the support pins 28 and the transfer mechanism leaves the processing container, the gate valve 13 is closed, the mounting table 21 moves up to the processing position and the processing space 30 is formed. While the mounting table 21 is moving up, the wafer W is heated to a predetermined temperature by the heater 22.

The valves V2 and V4 are opened (at time $t_1$ in the chart) and the $N_2$ gas is supplied into the processing space 30 via the gas supply path 50. Subsequently, the valve V1 is opened (at time $t_2$) and the $NH_3$ gas is supplied into the horizontal gas flow path 51 constituting the gas supply path 50.

Therefore, the $NH_3$ gas and the $N_2$ gas are supplied into the horizontal gas flow path 51 and the $N_2$ gas is supplied into the horizontal gas flow path 52 in parallel.

Figure 7:
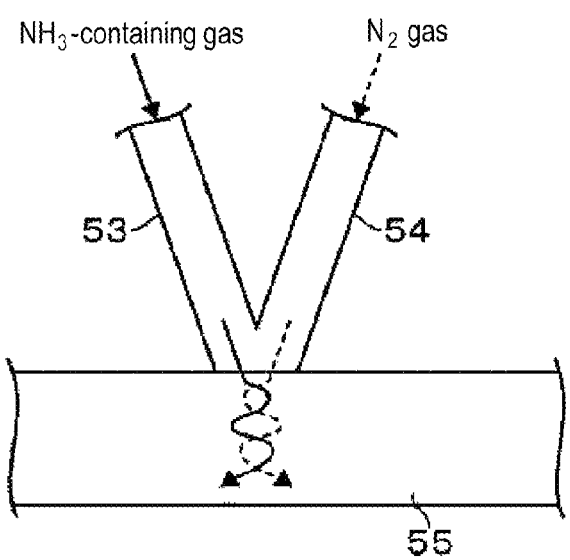
FIG. 7 is a schematic view showing how each gas flows in the gas flow path.
Figure 8:
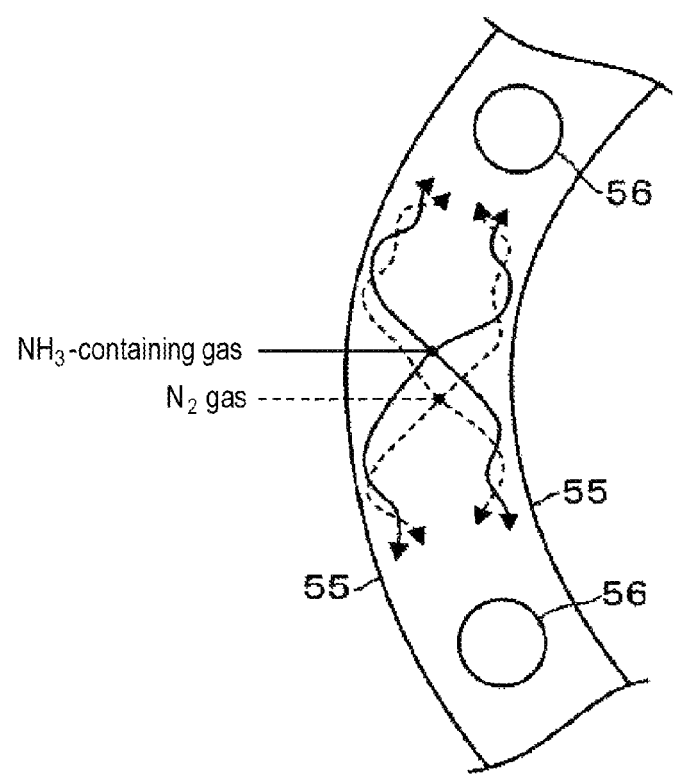
FIG. 8 is a schematic view showing how each gas flows in the gas flow path.

Hereinafter, for convenience of description, the $NH_3$ gas and the $N_2$ gas supplied into the horizontal gas flow path 51 are referred to as a $NH_3$-containing gas so as to be distinguished from the single $N_2$ gas supplied into the horizontal gas flow path 52. In FIGS. 7 and 8, the flows of the $NH_3$-containing gas and the $N_2$ gas are schematically indicated by a solid arrow and a dotted arrow, respectively. FIG. 7 is a side view of the first gas mixing chamber 55 and FIG. 8 is a top view of the first gas mixing chamber 55.

The $NH_3$-containing gas is supplied into the four branch paths 53 from the horizontal gas flow path 51 and is introduced to different positions in the circumferential direction of the first gas mixing chamber 55. The $N_2$ gas is supplied into the four branch paths 54 from the horizontal gas flow path 52 and is introduced to different positions in the circumferential direction of the first gas mixing chamber 55. In this manner, when the respective gases are introduced into the first gas mixing chamber 55, as shown in FIG. 7, since the $NH_3$-containing gas and the $N_2$ gas are supplied from a set of the branch paths 53 and 54 to the same position in the first gas mixing chamber 55, the $NH_3$-containing gas and the $N_2$ gas collide with each other and are mixed.

In addition, the $NH_3$-containing gas and the $N_2$ gas introduced into the first gas mixing chamber 55 as described above are prevented from being diffused in the annular first gas mixing chamber 55 as compared with a case where the first gas mixing chamber 55 has a circular shape rather than the annular shape. In other words, in a state where the diffusion of the gases toward the central portion side of the first gas mixing chamber 55 is blocked, the $NH_3$-containing gas and the $N_2$ gas flow in the first gas mixing chamber 55 in the circumferential direction, as shown in FIG. 8. At that time, since the first gas mixing chamber 55 is annular, both of the $NH_3$-containing gas and the $N_2$ gas are limited in directions of diffusion and flow in the circumferential direction without stagnation. Since the $NH_3$-containing gas and the $N_2$ circulate through a relatively narrow flow path without stagnation, the $NH_3$-containing gas and the $N_2$ gas collide with each other and are mixed during the circulation. Further, as described above, since the $NH_3$-containing gas and the $N_2$ gas are introduced to different positions in the circumferential direction of the first gas mixing chamber 55 via four sets of the branch paths 53 and 54, the mixing is performed in various places in the first gas mixing chamber 55 and proceeds with efficiency.

The mixture gas mixed in the first gas mixing chamber 55 is introduced into the discharge paths 56 and thereafter, flows through the second gas mixing chamber 57 and the gas flow path 58. Then, the mixture gas is supplied into the gas discharge part 41. After that, the mixture gas is discharged from the gas discharge part 41 into the diffusion space 34 of the shower head 33, and is further discharged from the shower head 33 into the processing space 30. Then, the mixture gas is supplied onto the wafer W. As a result, molecules of the $NH_3$ gas are adsorbed on the wafer W.

Thereafter, the valve V1 is closed (at time $t_3$) and only the $N_2$ gas supplied into the horizontal gas flow paths 51 and 52 is supplied into the processing space 30. The $NH_3$ gas remaining in the processing space 30 is purged by the supplied $N_2$ gas. Subsequently, the valve V3 is opened (at time $t_4$) and the HF gas is supplied into the horizontal gas flow path 52 constituting the gas supply path 50. Therefore, the $N_2$ gas is supplied into the horizontal gas flow path 51 and the $N_2$ gas and the HF gas are supplied into the horizontal gas flow path 52 in parallel.

When the HF gas and the $N_2$ gas supplied into the horizontal gas flow path 52 are referred to as a HF-containing gas so as to be distinguished from the single $N_2$ gas supplied into the horizontal gas flow path 51, the HF-containing gas and the $N_2$ gas are mixed in the first gas mixing chamber 55 and are supplied into the gas discharge part 41 in the same manner as in the case where the $NH_3$-containing gas and the $N_2$ gas are supplied into the horizontal gas flow paths 51 and 52. The mixture gas mixed in the first gas mixing chamber 55 is discharged into the processing space 30 from the gas discharge part 41 via the shower head 33 and reacts with the $NH_3$ gas adsorbed on the surface of the wafer W, whereby a $SiO_2$ film on the surface of the wafer W is etched.

Thereafter, the valve V3 is closed (at time $t_5$) and only the $N_2$ gas supplied into the horizontal gas flow paths 51 and 52 is supplied into the processing space 30. The $NH_3$ gas remaining in the processing space 30 is purged by the $N_2$ gas. After that, the same opening/closing operations of the valves V1 and V3 as the operations in times $t_2$ to $t_5$ are repeated. That is, while the $N_2$ gas is continuously supplied into the horizontal gas flow paths 51 and 52, the $NH_3$ gas and the HF gas are intermittently and alternately supplied, whereby a cycle including the supply of the $NH_3$ gas, the purge of the $NH_3$ gas, the supply of the HF gas and the purge of the HF gas is repeatedly performed on the wafer W. After the $SiO_2$ film is etched at a desired thickness by performing the cycle a predetermined number of times, the valves V2 and V4 are closed, the mounting table 21 moves down, and the wafer W is unloaded from the processing container 11 in the procedure reverse to the procedure in the loading of the wafer W into the processing container 11.

According to the etching apparatus 1, the downstream portions of the horizontal gas flow paths 51 and 52 into which gases are respectively supplied are branched to form the four branch paths 53 and the four branch paths 54. In the ring-shaped first gas mixing chamber 55, the four branch paths 53 are connected to different positions and the four branch paths 54 are connected to different positions. The first gas mixing chamber 55 is connected to the gas discharge part 41 which discharges the gases to the shower head 33. With this configuration, the gases supplied from the horizontal gas flow paths 51 and 52 can be sufficiently mixed and discharged from the shower head 33 onto the wafer W. Therefore, it is possible to suppress variations in the concentration of the $NH_3$ gas supplied from the horizontal gas flow path 51 and the concentration of the HF gas supplied from the horizontal gas flow path 52, in the plane of the wafer W. As a result, it is possible to etch the surface of the wafer W with high uniformity.

The horizontal gas flow paths 51 and 52 are not limited to supplying the gases for performing the ALE but may be applied to supplying the gases for performing an ALD (Atomic Layer Deposition). Specifically, for example, the valves V1 to V4 are opened/closed as shown in FIG. 6 such that a $TiCl_4$ (titanium tetrachloride) gas is supplied into the horizontal gas flow path 51 instead of the HF gas. Accordingly, a cycle including the supply of the $TiCl_4$ gas, the purge of the $TiCl_4$ gas, the supply of the $NH_3$ gas and the purge of the $NH_3$ gas may be repeated to form a TiN (titanium nitride) film on the surface of the wafer W. In other words, the present disclosure is not limited to the etching apparatus, but it can be applied to a film forming apparatus.

In the configuration example shown in FIGS. 3 and 4, the branch paths 53 and 54 are installed to be connected to the same position in the first gas mixing chamber 55. However, even if connection positions of the branch paths 53 and 54 in the first gas mixing chamber 55 are slightly apart from each other, since the gases discharged from the branch paths 53 and 54 collide with each other and are mixed, the branch paths 53 and 54 may be connected to the first gas mixing chamber 55 while being apart from each other. However, as shown in FIGS. 3 and 4, connecting the branch paths 53 and 54 to the same position in the first gas mixing chamber 55 is preferable for more reliable gas mixing.

Figure 9:
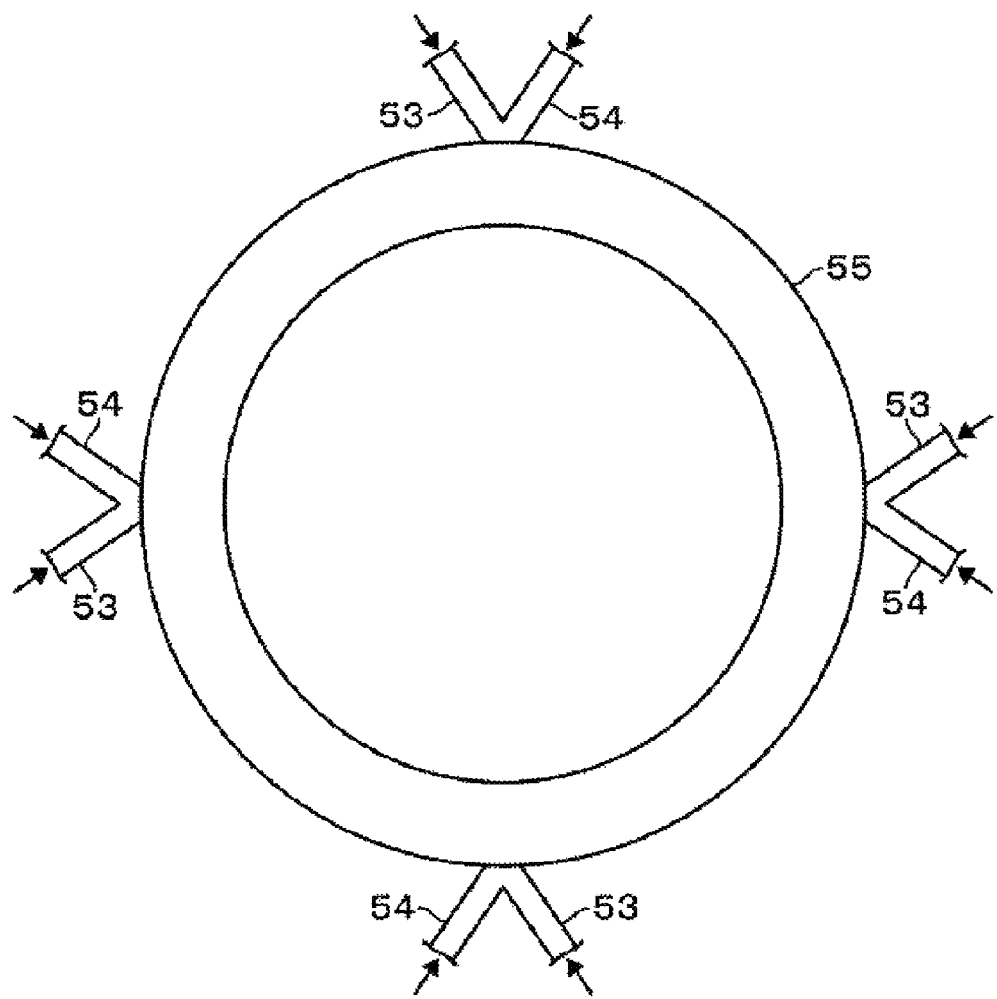
FIG. 9 is a plan view showing another configuration example of the gas flow path.

Further, with respect to the branch paths 53(54), it is sufficient if respective branch paths 53(54) are connected to different positions in the circumferential direction of the first gas mixing chamber 55, it is not limited to connecting the branch paths 53(54) to the upper side of the first gas mixing chamber 55. For example, as shown in FIG. 9, the branch paths 53(54) may be connected to a side portion in an outer portion of the first gas mixing chamber 55 or to a side portion of an inner portion of the first gas mixing chamber 55. Further, the number of branch paths 53(54) is not limited to four. Further, the discharge path 56 is not limited to being connected to the lower portion of the first gas mixing chamber 55, but may be connected to the side portion in the inner or outer portion of the first gas mixing chamber. Further, although the gases supplied from the two horizontal gas flow paths are mixed, it is also possible to mix the gases supplied from two or more gas flow paths. That is, gas flow paths may be installed in addition to the horizontal gas flow paths 51 and 52, and branched downstream ends of the gas flow paths may be connected to different positions in the circumferential direction of the first gas mixing chamber 55. The present disclosure is not limited to the gas supplying methods exemplified so far. For example, the NH$_3$ gas and the HF gas may be simultaneously supplied into the horizontal gas flow path 51 and the horizontal gas flow path 52. Even if the NH$_3$ gas and the HF gas are simultaneously supplied into the horizontal gas flow paths 51 and 52, for example, the NH$_3$ gas and the HF gas can be intermittently supplied. It should be noted that the configuration examples described above may be appropriately changed or used in proper combination.

(Evaluation Test)

Evaluation tests conducted for the present disclosure will be described below. In evaluation test 1, a state of the wafer W after etching was investigated in a case where ALE was actually performed by using the above etching apparatus 1 according to the above-described procedure. The "state after etching" used herein means an average value (nm in the unit) of the amount of etching in each portion in the plane of the wafer W and the uniformity of etching in the plane of the wafer W. Specifically, the uniformity (% in the unit) of etching is a value representing the standard deviation (1σ) of etching rates as a percentage of the average value of the etching rates. Therefore, a smaller absolute value of the etching uniformity means that etching is performed with higher uniformity in the plane of the wafer W. Further, an image in which a distribution of etching amount in the plane of the wafer W expressed as a color gradation was acquired. In other words, based on the measurement results obtained by experiment, the surface of the wafer W has been colored according to the etching amount.

The evaluation test 1 varies the flow rate of the NH$_3$ gas and the flow rate of the HF gas for each wafer W. Specifically, an evaluation test 1-1 is conducted with the NH$_3$ gas flow rate of 275 sccm and the HF gas flow rate of 100 sccm. An evaluation test 1-2 is conducted with the NH$_3$ gas flow rate of 225 sccm and the HF gas flow rate of 150 sccm. An evaluation test 1-3 is conducted with the NH$_3$ gas flow rate of 150 sccm and the HF gas flow rate of 225 sccm. An evaluation test 1-4 is conducted with the NH$_3$ gas flow rate of 125 sccm and the HF gas flow rate of 250 sccm. An evaluation test 1-5 is conducted with the NH$_3$ gas flow rate of 100 sccm and the HF gas flow rate of 275 sccm.

Processing conditions other than the NH$_3$ gas flow rate and the HF gas flow rate are listed below. When etching is performed, the pressure in the processing space 30 is 2.0 Torr (266.6 Pa), the time taken to supply the NH$_3$ gas in one cycle is 1 second, the time taken to supply the HF gas in one cycle is 1.5 seconds, the flow rate of N$_2$ gas supplied into the processing space 30 when the HF gas or the NH$_3$ is supplied gas is 225 sccm, the flow rate of N$_2$ gas for purging supplied into the processing space 30 is 600 sccm, the time taken for one purging is 25 seconds, and the number for performing the cycles is 50.

Figure 10:
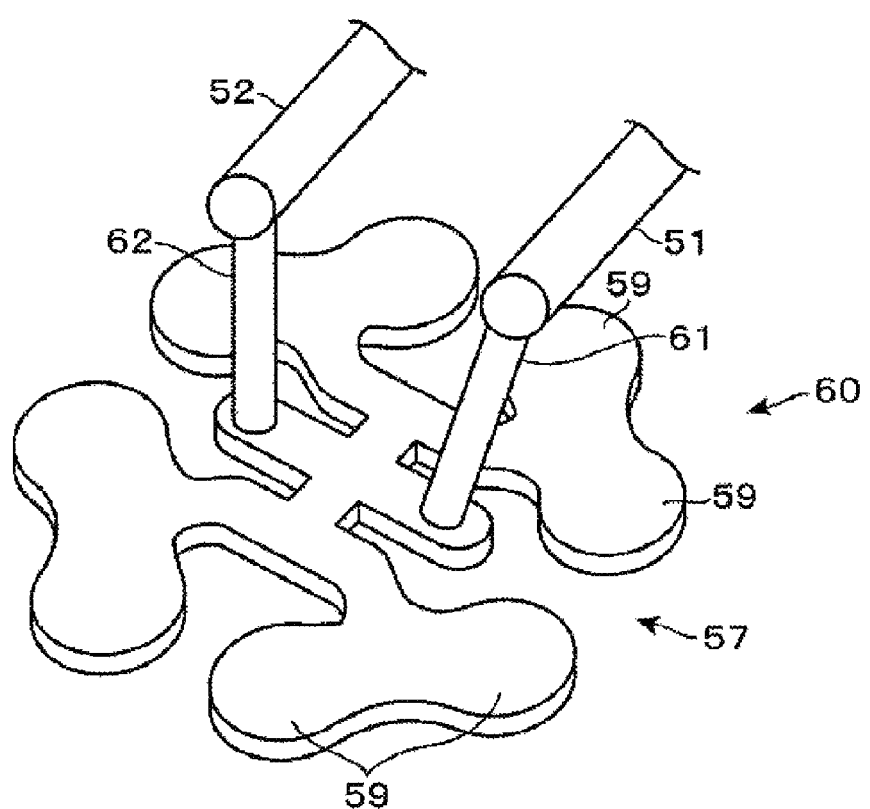
FIG. 10 is a perspective view of a gas flow path installed in an etching apparatus used in a comparative test.

As comparative test 1, an etching apparatus different in only gas supply path from the etching apparatus 1 was used to conduct the same experiment as in the evaluation test 1. FIG. 10 is a perspective view showing the configuration of a gas supply path 60 of the comparative test 1. The gas supply path 60 is different from the gas supply path 50 of the etching apparatus 1 in that, while the gas supply path 60 does not include the branch paths 53 and 54, the gas supply path 60 includes flow paths 61 and 62 extending downward from the downstream end portions of the horizontal gas flow paths 51 and 52, respectively. The downstream ends of the flow paths 61 and 62 are respectively connected to the ends of two flow paths, which do not form the branch end portion 59, among the six elongated gas flow paths extending from a central portion of the second gas mixing chamber 57.

The processing conditions in the comparative test 1 are the same as the processing conditions in the evaluation test 1. Therefore, the comparative test 1 varies the NH$_3$ gas flow rate and the HF gas flow rate for each wafer W in the same manner as the evaluation test 1. In the comparative test 1, comparative tests 1-1, 1-2, 1-3, 1-4 and 1-5 are conducted with the NH$_3$ gas flow rate and the HF gas flow rate set in the same manner as the evaluation tests 1-1, 1-2, 1-3, 1-4 and 1-5.

The following Table 1 summarizes the results of the evaluation test 1 and the comparative test 1. The etching uniformity is higher in the evaluation test 1 than in the comparative test 1 under the conditions having the same NH$_3$ gas flow rate and the same HF gas flow rate. Therefore, it is believed that the gases respectively supplied from the horizontal gas flow paths 51 and 52 are more sufficiently mixed in the evaluation test 1 than the comparative test 1.

TABLE 1

| | | 1-1 | 1-2 | 1-3 | 1-4 | 1-5 |
|---|---|---|---|---|---|---|
| Com. Test | Average value of etching amount (nm) | 8.7 | 45.4 | 76.1 | 67.9 | 64.4 |
| | Uniformity of etching (±%) | 119 | 78 | 34 | 43 | 49 |
| Eval. Test | Average value of etching amount (nm) | 9.7 | 21.4 | 59.3 | 78.3 | 56.7 |
| | Uniformity of etching (±%) | 91 | 55 | 27 | 18 | 30 |

Figure 11:
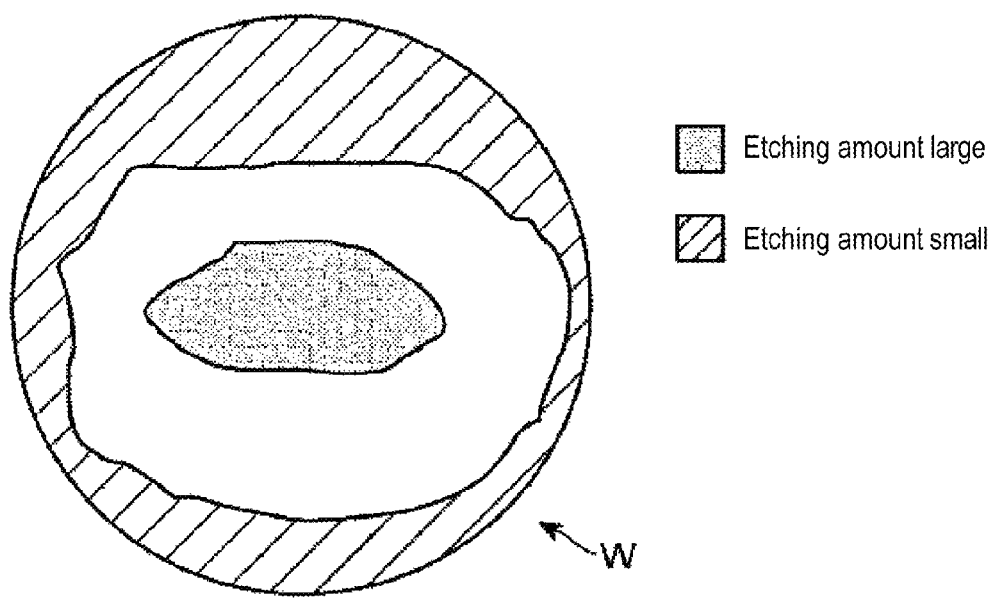
FIG. 11 is a plan view of a wafer showing a result of the comparative test.
Figure 12:
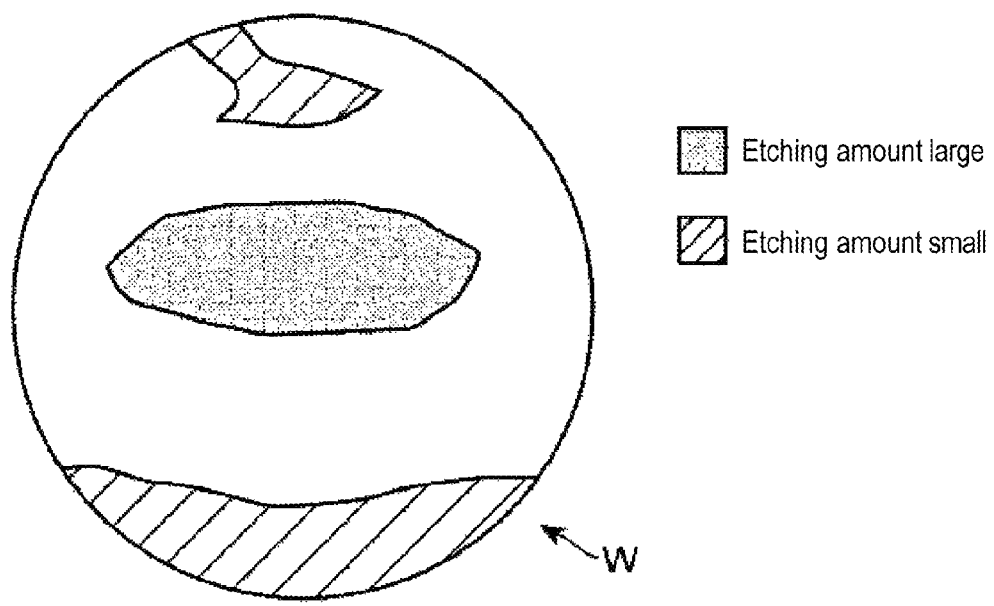
FIG. 12 is a plan view of a wafer showing a result of the comparative test.

In addition, from each image of the wafers W showing the distribution of the etching amount obtained in the comparative tests 1-1 to 1-5, it was confirmed that a relatively large variation was found in the etching amount in each portion in the plane of the wafer W. In other words, the deviation between the position of a region where the etching amount in the plane of the wafer W was relatively large and the position of a region where the etching amount was relatively small was relatively large for each wafer W. For example, the results of the comparative tests 1-3 and 1-4 are shown in FIGS. 11 and 12, respectively. In FIGS. 11 and 12, in the plane of the wafer W, an area having a relatively small etching amount is indicated by a hatched line and an area having a relatively large etching amount is indicated by a gray scale.

Figure 13:
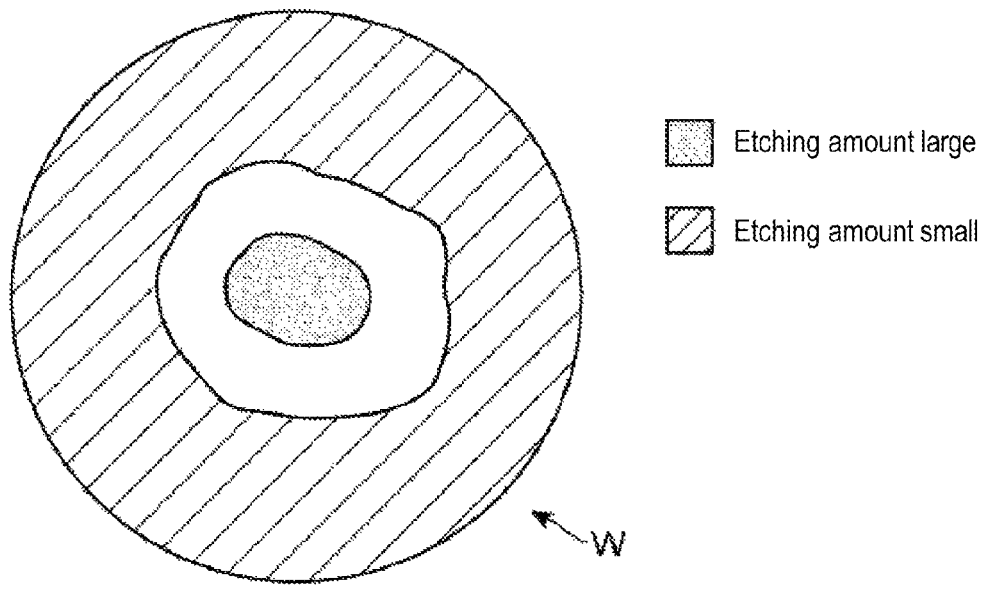
FIG. 13 is a plan view of a wafer showing a result of an evaluation test.

However, from each image of the wafers W showing the distribution of the etching amount obtained in the evaluation tests 1-1 to 1-5, the deviation between the position of a region where the etching amount in the plane of the wafer W was relatively large and the position of a region where the etching amount was relatively small was relatively small for each image. For example, the results of the evaluation tests 1-3 and 1-4 are shown in FIG. 13. In FIG. 13, in the plane of the wafer W, an area having a relatively small etching amount is indicated by a hatched line and an area having a relatively large etching amount is indicated by a gray scale in the same manner as indicated in FIGS. 11 and 12.

In a case where the flow rate of the $NH_3$ gas and the flow rate of the HF gas supplied into the horizontal gas flow paths 51 and 52 are changed so that the amount of the $NH_3$ gas and the HF gas supplied onto the plane of the wafer W is changed, the amount of the $NH_3$ gas and the HF gas supplied into a specific region is varied. However, when the gases respectively supplied from the horizontal gas flow paths 51 and 52 are sufficiently mixed and supplied onto the wafer W, a ratio of the amount of the $NH_3$ gas and the HF gas supplied into a specific region to the amount of the $NH_3$ gas and the HF gas supplied to other regions is not varied. That is to say, when the gases supplied from the horizontal gas flow paths 51 and 52 are sufficiently mixed and supplied onto the wafer W, in the plane of the wafer W, the position of an area having a relatively large etching amount and the position of an area having relatively small etching amount become regular between the wafers W. Therefore, from the images showing the distribution of the etching amount, it was also confirmed that the gases were more sufficiently mixed in the evaluation test 1 than the comparative test 1.

According to the present disclosure in some embodiments, a first gas flow path whose downstream portion is branched to form a plurality of first branch paths, a second gas flow path whose downstream portion is branched to form a plurality of second branch paths, and an annular mixing chamber in which the plurality of first branch paths are connected to positions spaced from each other in the circumferential direction and the plurality of second branch paths are connected to positions separated from each other in the circumferential direction are provided. Since the first gas and the second gas respectively supplied from the first gas flow path to the respective positions of the annular mixing chamber and supplied from the second gas flow path to the respective positions of the annular mixing chamber are limited in directions of diffusion and flow to a discharge path connected to the mixing chamber. Therefore, it is possible to mix the first gas and the second gas with high reliability in each portion of the mixing chamber and to supply the first gas and the second gas onto the substrate for processing.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An apparatus for processing a gas, comprising:
a mounting part installed in a processing container having a vacuum atmosphere and on which a substrate is mounted;
a first gas flow path in which a first gas is supplied from a first gas supply mechanism to an upstream portion of the first gas flow path, and a downstream portion of the first gas flow path is branched to form a plurality of first branch paths;
a second gas flow path in which a second gas is supplied from a second gas supply mechanism to an upstream portion of the second gas flow path, and a downstream portion of the second gas flow path is branched to form a plurality of second branch paths;
an annular mixing chamber to which a discharge path is connected; and
a gas discharge part being configured to discharge a mixture gas supplied from the discharge path onto the substrate,
wherein the annular mixing chamber includes a plurality of first positions separated from each other in a circumferential direction, each of downstream ends of the plurality of first branch paths being connected to each of the plurality of first positions; and a plurality of second positions separated from each other in the circumferential direction, each of downstream ends of the plurality of second branch paths being connected to each of the plurality of second positions, and is configured to generate the mixture gas by mixing the first gas and the second gas flowing from the first branch paths and the second branch paths into the discharge path.

2. The apparatus of claim 1, wherein each of the plurality of first positions and each the plurality of second positions coincide with each other.

3. The apparatus of claim 1, wherein the discharge path is connected to a position separated from the plurality of first positions and the plurality of second positions in the circumferential direction of the mixing chamber.

4. The apparatus of claim 1, wherein the plurality of first gas flow paths and the plurality of second gas flow paths are connected to an upper portion of the mixing chamber, and
wherein the discharge path is connected to a lower portion of the mixing chamber.

5. The apparatus of claim 1, wherein a plurality of the gas discharge parts and a plurality of the discharge paths are provided,
wherein a gas shower head having a flat surface facing the mounting part and a plurality of gas discharge holes formed in the flat surface is installed in a lower portion of a ceiling part of the processing container, and
wherein each of the gas discharge parts is installed to discharge a gas laterally into a gas diffusion space formed between the ceiling part of the processing container and the gas shower head.

6. The apparatus of claim 1, wherein the first gas supply mechanism is configured to independently supply a first inert gas and a first processing gas, which constitute the first gas, into the first gas flow path, and wherein the second gas supply mechanism is configured to independently supply a second inert gas and a second processing gas, which constitute the second gas, into the second gas flow path, and the apparatus further comprising: a control part outputting a control signal to cause, while the first inert gas and the second inert gas being continuously supplied in parallel into the first gas flow path and the second gas flow path, respectively, the first processing gas and the second processing gas to be intermittently supplied into the first gas flow path and the second gas flow path, respectively.

* * * * *